United States Patent [19]

Wesner

[11] 4,081,731
[45] Mar. 28, 1978

[54] PULSE WIDTH MODULATED SERVO AMPLIFIER WITH OVER-CURRENT PROTECTION

[75] Inventor: Charles R. Wesner, Crozet, Va.

[73] Assignee: Sperry Rand Corporation, New York, N.Y.

[21] Appl. No.: 711,189

[22] Filed: Aug. 3, 1976

[51] Int. Cl.² ............................................. G05B 11/28
[52] U.S. Cl. ................................ 318/599; 330/124 R; 318/681
[58] Field of Search .............................. 318/681, 563; 330/124 R, 51; 318/599

[56] References Cited

U.S. PATENT DOCUMENTS

| | | | |
|---|---|---|---|
| 3,323,031 | 5/1967 | Kasper et al. | 318/681 |
| 3,525,029 | 8/1970 | Joslyn et al. | 318/681 X |
| 3,588,710 | 6/1971 | Masters | 318/599 X |
| 3,795,869 | 3/1974 | Mionet et al. | 330/51 X |

Primary Examiner—B. Dobeck

Attorney, Agent, or Firm—Howard P. Terry; Joseph M. Roehl

[57] ABSTRACT

Direct current error signals of either polarity are converted to a unipolar voltage and used to offset a triangular timing wave. The offset wave is applied to threshold amplifier so as to produce pulse width modulated signals. The pulse width modulated signals, together with a polarized direction signal and a clock signal from the triangular wave source, is applied to a servo amplifier containing first and second channels, each containing a flip flop for opening the associated channel in accordance with the polarity of the direction signal so as to pass direct or inverted pulse width modulating signals, respectively, through amplifier and filter circuits to the output terminal. Each of the amplifier circuits has a current sensing resistor, and a switching transistor arranged to switch the associated flip flop and thereby open that channel whenever the current through the sensing resistor exceeds a predetermined level.

8 Claims, 2 Drawing Figures

PULSE WIDTH MODULATED SERVO AMPLIFIER WITH OVER-CURRENT PROTECTION

BACKGROUND OF THE INVENTION

1. Field of the Invention

The present invention relates to electronic amplifiers and, more specifically, to pulse type amplifiers for driving servo motors.

2. Description of the Prior Art

Pulse width modulated servo amplifiers are widely used in control systems for aircraft, marine, industrial and computer applications. Ordinarily, such amplifiers are protected against damage from accidental overload only by fuses or circuit breakers which must be replaced or reset before operation can be resumed after a malfunction. The circuit of the present invention provides automatic reset after overcurrent trip at the start of each modulation pulse.

SUMMARY OF THE INVENTION

A pulse width modulated servo amplifier is protected from damage caused by accidental overload by reducing the pulse width to a safe level. Automatic reset after overcurrent trip occurs at the start of each modulation pulse.

DESCRIPTION OF THE PREFERRED EMBODIMENT

One of the more important applications of the circuit of the present invention is in an electrohydraulic steering system for marine vessels. For purposes of illustration, the invention will be described with respect to such a steering system.

Typically, in such installations, an electrical signal indicative of the helm position is developed and used to actuate a hydraulic pump so as to develop the hydraulic pressures which are used to position the rudder. Three d.c. signals are developed in such systems: A rudder order signal having a polarity and magnitude indicative of the direction and amount of helm deflection, a rudder angle signal indicative of the direction and magnitude of the rudder deflection, and a pump stroke signal indicative of the response of the pump to a given rudder order.

Figure 1:
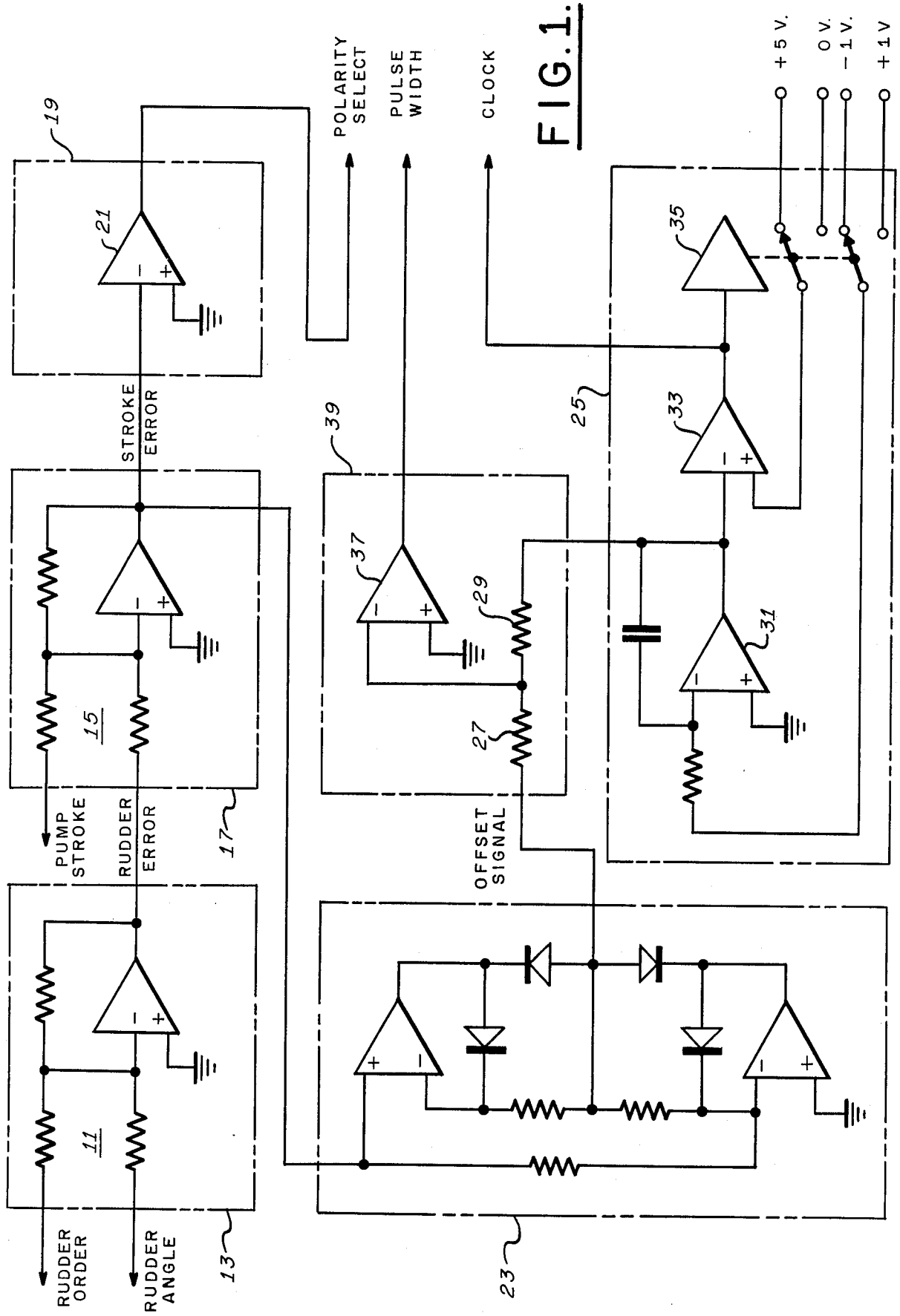
FIG. 1 is a diagram illustrating an input circuit useful in converting d.c. error signals into pulse width modulated signals and polarity signals that may be utilized in the circuit of FIG. 2.

FIG. 1 illustrates a signal conversion input circuit useful with such a steering system. The rudder order and rudder angle signals are applied to a summing network 11 in an amplifier circuit 13 to develop a rudder error signal indicative of the amount by which the rudder angle deviates from the commanded position. The rudder error signal and the pump stroke signals are applied to a second summing network 15 in a second amplifier circuit 17, to produce a stroke error signal.

The stroke error signal is a d.c. signal having a polarity and magnitude indicative of the direction and amount of deviation of the pump position from the commanded position.

The stroke error signal is passed through a polarity sensor circuit 19 which includes a voltage comparator 21. The sensor operates to provide a polarity select signal which has a constant magnitude but a polarity indicative of the polarity of the stroke error signal.

The stroke error signal is also applied to an absolute magnitude circuit 23 which effectively operates as a full wave rectifier so as to provide an offset signal having a magnitude equal to that of the stroke error signal, but a negative polarity regardless of the polarity of the stroke error signal. As indicated in FIG. 1, a straightforward amplifier network may be used for this purpose.

The offset signal is combined with the output of a triangular wave generator 25 in a summing network comprising the resistors 27 and 29. The triangular wave generator 25 is a straightforward circuit, and for purposes of illustration may include an integrating amplifier 31, a voltage comparator 33 and an analog switch 35. The analog switch 35 has been shown functionally in FIG. 1 as mechanically driving a pair of doublethrow switches used to bias the components 31 and 33. In actual applications, the logic gate and the associated switches are part of a commercially available integrated circuit component such as RCA Catalogue N. 4016. For purposes of illustration, typical switch voltages have been indicated in FIG. 1.

During operation, with the voltages and switches in the position shown, the amplifier 31 integrates up to a level of 5 volts whereupon the comparator 33 causes the operational amplifier to reverse the switch positions so that the integrator 31 proceeds to integrate down to the zero level. Thus, the wave generator 25 produces a triangular wave which varies between zero and +5 volts.

The sum of the offset signal and triangular wave is applied to the inverting terminal of a voltage comparator 37 in a pulse width modulator 39. This combined voltage consists of a triangular wave train alternating between the negative level of the offset signal and a level 5 volts above that of the offset signal. Assuming a finite value of offset signal, as the triangular wave commences to rise from the negative level of the offset signal, comparator 37 produces a positive output. When the magnitude of the triangular wave exceeds the magnitude of the offset signal, the comparator 37 will be switched so as to produce a negative output voltage. This negative voltage will persist until the magnitude of the triangular wave again becomes less than that of the offset signal. Thus, the output of the pulse width modulator consists of a train of positive pulses each having a pulse width proportional to the absolute magnitude of the stroke error signal.

A clock signal is also derived from the wave generator for synchronizing the operation of the circuit.

Figure 2:
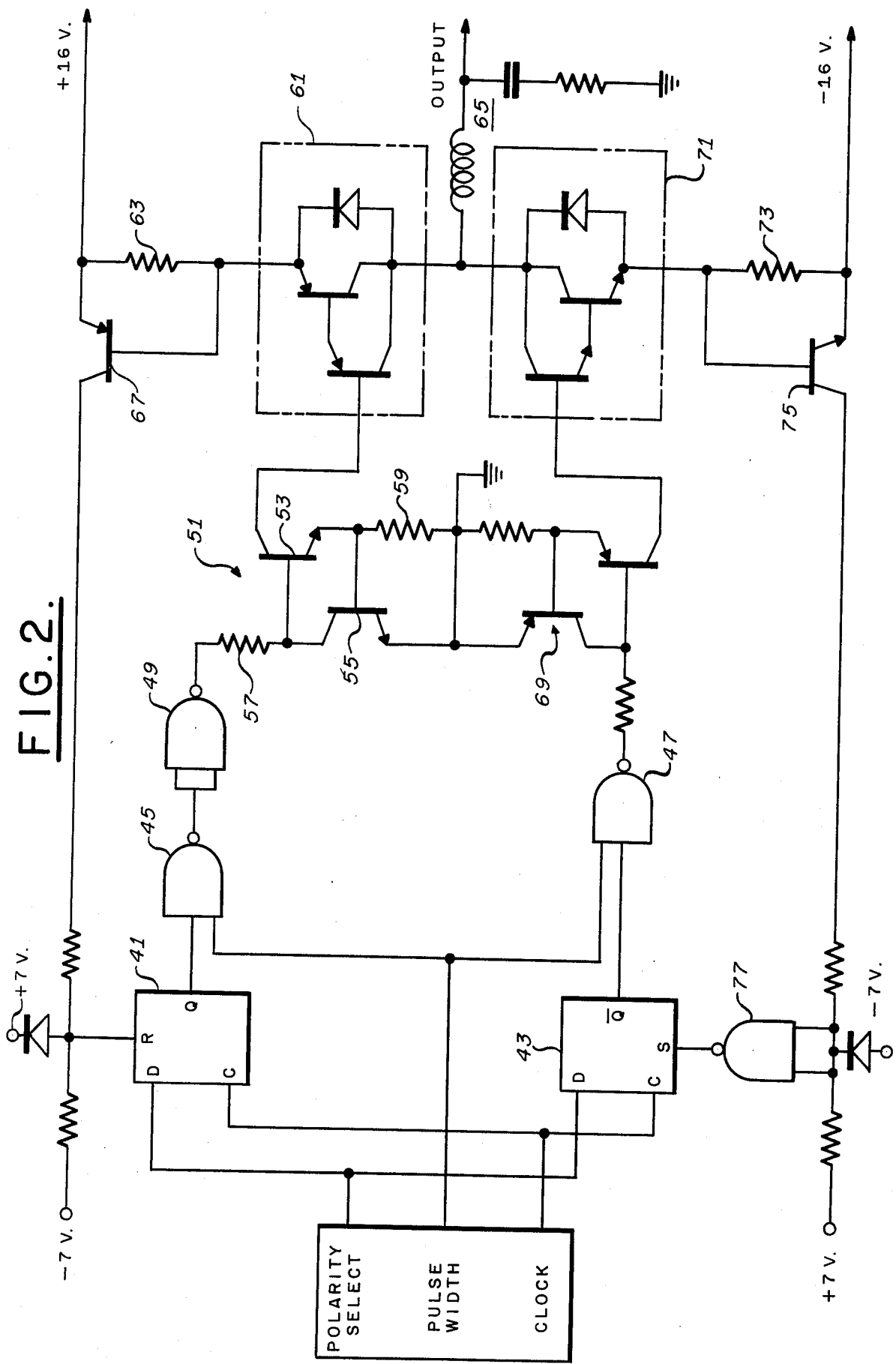
FIG. 2 is a diagram of a servo amplifier employing the overload protection features of the invention.

The polarity select, pulse width and clock signals are applied to the amplifier circuit depicted in FIG. 2. The amplifier circuit contains first and second channels for operating a servo motor load in the forward or reverse directions, respectively, as determined by the polarity of the polarity select signal.

The individual channels are opened or closed by means of D-type flip flops 41 and 43, respectively. A clock pulse applied to the flip flops will switch the flip flop 41 to the binary ONE state, so as to produce a high level Q output voltage if the accompanying polarity select voltage is positive, whereas a clock pulse accompanied by a negative polarity select signal will switch the flip flop 43 to the binary ZERO state so as to produce a high level $\overline{Q}$ signal. A high level Q voltage appearing at the flip flop 41 is used to enable a NAND gate 45 in the first channel and a high level $\overline{Q}$ voltage from the flip flop 43 is used to enable a NAND gate 47 in the second channel.

Signals from the NAND gate 45 in the first channel are inverted in an inverting gate 49 and applied to a conventional constant-current transistor network 51 containing the transistors 53 and 55 and the resistors 57 and 59. The collector current from the transistor 53 in the constant current network 51 is used to drive a conventional Darlington circuit 61.

The Darlington circuit is energized from positive d.c. source through a series resistor 63. The output signal from the Darlington circuit is filtered by means of a straightforward lowpass filter 65 and applied to an output terminal. The filter 65 is used to prevent switching spikes and to commutate motor load current upon turn-off.

The series resistor 63 is connected to an overload transistor 67 which remains in the cutoff condition in normal operation, but is driven into conduction if an excessive current passes through the series resistor 63.

The collector electrode of the transistor 67 is coupled through a biasing network to the reset terminal of the flip flop 41. Under normal operating conditions, the reset terminal is held at a low voltage so as to be ineffective. However, if the transistor 67 is driven into conduction, a high voltage from the positive voltage source is applied to the reset terminal which serves to reset the flip flop 41 and change the voltage at the Q output terminal to the zero voltage level.

Signals from the NAND gate 47 in the second channel are applied through a constant current network 69 and a Darlington circuit 71 and the filter network 65 to the output terminal. The network 69 and the Darlington circuit 71 are similar to the corresponding circuits in the first channel except that the transistor components are complementary types with respect to their counterparts in the first channel. The use of complementary type transistors in the second channel provides output pulses of polarity opposite to that of the pulses occurring in response to signals passing through the first amplifier channel.

The Darlington circuit 71 is energized from a suitable negative voltage source through a series resistor 73 which is connected to an overload transistor 75. The collector terminal of the overload transistor 75 is coupled to the set terminal of the flip flop 43 through a biasing network and an inverting gate 77.

Under normal operating conditions, the voltage developed across the series resistor 73 is sufficiently low so that the transistor 75 remains in the cutoff condition. However, abnormally high currents through the Darlington circuit 71 increase the voltage drop across the series resistor 73 and drive the overload transistor 75 into conduction so that a large voltage from the negative source is coupled to the set terminal of the flip flop 43 which switches the flip flop and changes the voltage at the $\overline{Q}$ terminal to a low level and thus turns off the second channel.

The operation of the circuit of FIG. 2 can be better understood by considering a particular operating condition wherein a positive polarity select voltage is applied to the flip flops. The succeeding clock pulse will actuate the flip flops, thereby enabling gate 45 in the first channel and disabling gate 47 in the second channel. The positive pulse width modulated signals received under these conditions will pass through the gate 45 and be inverted in the gate 49 so as to appear as positive pulses at the input to the constant current network 51. These pulses, in turn, will actuate the Darlington circuit 61 and pass a current to the filtering circuit 65. Thus a voltage pulse will appear at the output terminal which has a duration exactly equal to the duration of the pulse width modulated signal from the circuit of FIG. 1 and therefore proportional to the magnitude and of the same polarity as the stroke error signal developed in the circuit of FIG. 1.

However, if the load coupled to the output terminal draws an excessive current, an abnormal voltage would be developed across the series resistor 63 so as to drive the overload transistor 67 into conduction and thereby reset the flip flop 41 and open the associated channel so that excessive current cannot damage the amplifier or load. The circuit provides automatic reset after overcurrent trip at the start of each modulation pulse and thereby eliminates the need for replacing fuses or manually resetting circuit breakers as is the case in prior art circuits.

The second channel operates in the same manner but produces output pulses of the opposite polarity in accordance with the reversed polarity of the polarity select signal.

The use of the present circuit provides a simple, economical and compact device in that readily available integrated circuit components may be used throughout the circuit and that the same integrated circuits which are used for pulse steering may also be used for over-circuit protection.

It will be appreciated that the particular circuit components depicted in the Figures have been chosen for purposes of illustration only and that equivalent components may be substituted as will be obvious to those skilled in the art.

While the invention has been described in its preferred embodiment, it will be understood that the words which have been used are words of description rather than limitation and that changes within the purview of the appended claims may be made without departing from the true scope and spirit of the invention in its broader aspects.

I claim:

1. A servomotor drive circuit of the type in which the extent and direction of rotor movement is controlled by the duration and polarity, respectively, of pulses in an output pulse train; said circuit including dual channel amplifier means, and input circuit means to provide polarity select direction control signals and an input pulse width modulated wave train to said amplifier means; the first and second of said channels each including means to enable only that channel in accordance with first and second values of the polarity select signal, respectively; means to pass the pulses in an input wave train through an enabled channel; power amplifying means in each channel connected to provide output pulses co-extensive with the pulses in the input wave train being passed by that channel, the amplifying means in said first and second channels being further connected to provide positive and negative output pulses, respectively; means for detecting the instantaneous magnitude of the current flowing through each power amplifying means; and means responsive to said detection means for disabling a channel whenever the magnitude of the detected current in that channel exceeds a predetermined value, said disabling means being operative to maintain the channel in a disabled condition until the start of the succeeding input pulse applied to that channel.

2. The drive circuit of claim 1 wherein the enabling means in each channel includes a flip flop arranged to be switched to a binary state indicative of the polarity of said direction control signal and individual gating means in said first and second channels connected to the Q and $\overline{Q}$ output terminals, respectively, of the flip flop in the associated channel so as to be enabled when the voltage on the respective flip flop output terminal is at a high level.

3. The drive circuit of claim 2 wherein the flip flops are clocked flip flops and the input circuit means further includes means to couple clock pulses synchronized with the pulses in the input wave train to the clock terminals of said flip flops.

4. The drive circuit of claim 3 wherein said means to pass the pulses in the input wave train includes means to couple such pulses from the input circuit means to each of said gating means whereby the individual gating means will pass the input pulses only when that gating means is enabled by the associated flip flop.

5. The drive circuit of claim 4 wherein each flip flop is of the type containing means to switch the flip flop to a particular binary state by means of an external signal, and wherein the means for disabling each channel includes means responsive to the detection means in that channel for reversing the state of the associated flip flop in response to an excessive current.

6. The drive circuit of claim 5 wherein the detection means in each channel includes a resistor in series with the power amplifying means and an overload transistor responsive to the current through said resistor, said transistor being maintained in the cutoff condition unless an excessive current flows through the resistor, said transistor further being arranged to couple a switching signal to the associated flip flop whenever the transistor is driven into conduction.

7. The drive circuit of claim 6 wherein the input circuit means is responsive to d.c. signals of either polarity, said input means including first means for producing a constant level direction control signal having a polarity corresponding to that of said d.c. signal, and second means for producing a pulse width modulated wave train, said second means including means to produce an offset signal having a constant polarity but a magnitude equal to that of said d.c. signal and modulating means for producing a train of rectangular pulses having durations representative of the magnitude of such offset signal.

8. The drive circuit of claim 7 wherein the modulating means includes means to produce a triangular wave oscillating between zero voltage level and a specified positive value, means to offset the triangular wave in a negative direction by an amount equal to the value of the offset voltage, and means to produce a binary output wave having an instantaneous value indicative of the instantaneous polarity of the offset triangular wave.

* * * * *